US010921721B1

(12) United States Patent
Fu et al.

(10) Patent No.: US 10,921,721 B1
(45) Date of Patent: Feb. 16, 2021

(54) MEASUREMENT SYSTEM AND GRATING PATTERN ARRAY

(71) Applicant: Applied Materials, Inc., Santa Clara, CA (US)

(72) Inventors: Jinxin Fu, Fremont, CA (US); Yifei Wang, Sunnyvale, CA (US); Yongan Xu, Santa Clara, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/596,237

(22) Filed: Oct. 8, 2019

Related U.S. Application Data

(60) Provisional application No. 62/900,362, filed on Sep. 13, 2019.

(51) Int. Cl.
*G03F 7/20* (2006.01)
*G03F 9/00* (2006.01)
(Continued)

(52) U.S. Cl.
CPC ............. *G03F 9/7076* (2013.01); *G01D 5/38* (2013.01); *G02B 5/1861* (2013.01);
(Continued)

(58) Field of Classification Search
CPC .... G01N 21/47; G01N 21/95; G03F 7/70641; G03F 7/7076; G03F 7/70133; G02B 5/1866
(Continued)

(56) References Cited

U.S. PATENT DOCUMENTS 5,074,666 A  12/1991  Barnes et al.
6,577,786 B1  6/2003  Cappiello et al.
(Continued)

FOREIGN PATENT DOCUMENTS

CN  107449361 A  12/2017
CN  108303038 A  7/2018
(Continued)

OTHER PUBLICATIONS

International Search Report/Written Opinion issued to PCT/US2020/026829 dated Aug. 4, 2020.
(Continued)

*Primary Examiner* — Hung Nguyen
(74) *Attorney, Agent, or Firm* — Patterson + Sheridan LLP

(57) ABSTRACT

Embodiments of the present disclosure include measurement systems and grating pattern arrays. The measurement systems include multiple subsystems for creating diffraction patterns or magnified real images of grating regions on a substrate. The measurements systems are configured to reflect and transmit light, and the reflected and transmitted beams create diffraction patterns and enlarged images. The diffraction patterns and images provide information on grating pitch and angles of grating regions. Grating pattern arrays disposed on a substrate include main regions and reference regions. The reference regions are used to locate corresponding main regions. The measurement systems do not include a rotating stage, and thus precise control of rotation of a stage is not needed.

20 Claims, 10 Drawing Sheets

(51) Int. Cl.
*G01D 5/38* (2006.01)
*G02B 5/18* (2006.01)

(52) U.S. Cl.
CPC ...... *G03F 7/70133* (2013.01); *G03F 7/70775* (2013.01); *G03F 9/7049* (2013.01); *G03F 9/7088* (2013.01)

(58) Field of Classification Search
USPC ........................................... 356/401
See application file for complete search history.

(56) References Cited

U.S. PATENT DOCUMENTS

| | | |
|---|---|---|
| 6,762,881 B2 | 7/2004 | Kleemann et al. |
| 8,169,703 B1 | 5/2012 | Mossberg et al. |
| 9,784,690 B2 * | 10/2017 | Sapiens .............. G01N 21/9501 |
| 2001/0046087 A1 | 11/2001 | Hoose |
| 2004/0012775 A1 | 1/2004 | Kinney et al. |
| 2010/0140312 A1 | 6/2010 | Dong et al. |
| 2013/0342831 A1 * | 12/2013 | Levinski ................ G01N 21/47 356/237.1 |
| 2014/0126060 A1 * | 5/2014 | Seki ..................... G02B 5/1809 359/569 |
| 2016/0033398 A1 * | 2/2016 | Kim .................... G03F 7/70641 356/243.1 |
| 2016/0313115 A1 | 10/2016 | Liu et al. |
| 2017/0176348 A1 | 6/2017 | Leem et al. |
| 2017/0350689 A1 | 12/2017 | Matsushita et al. |
| 2019/0212480 A1 | 7/2019 | Evans et al. |

FOREIGN PATENT DOCUMENTS

| | | |
|---|---|---|
| CN | 109884061 A | 6/2019 |
| WO | 2019086550 A2 | 5/2019 |

OTHER PUBLICATIONS

International Search Report/Written Opinion issued to PCT/US2020/047750 dated Nov. 17, 2020.

* cited by examiner

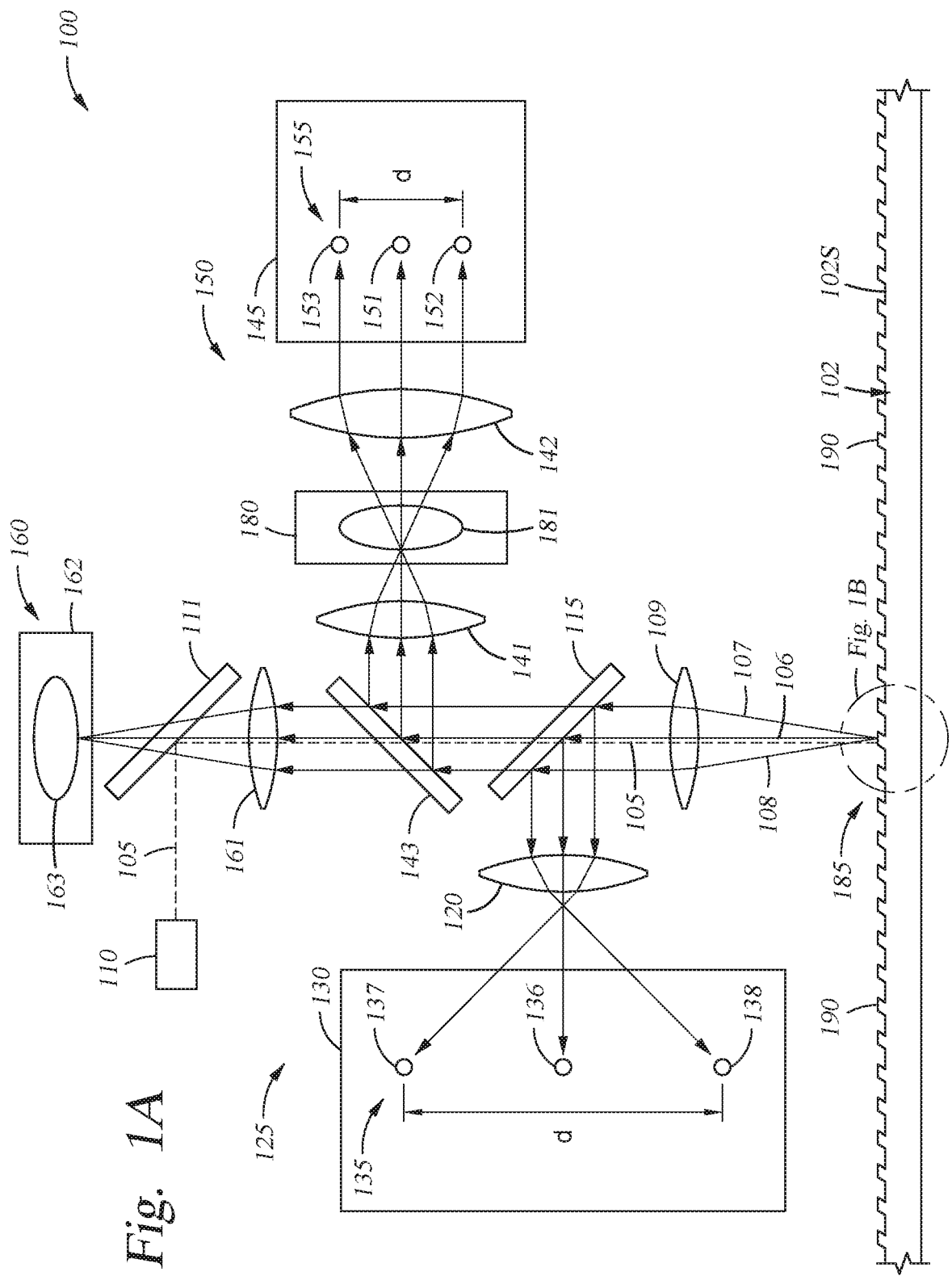

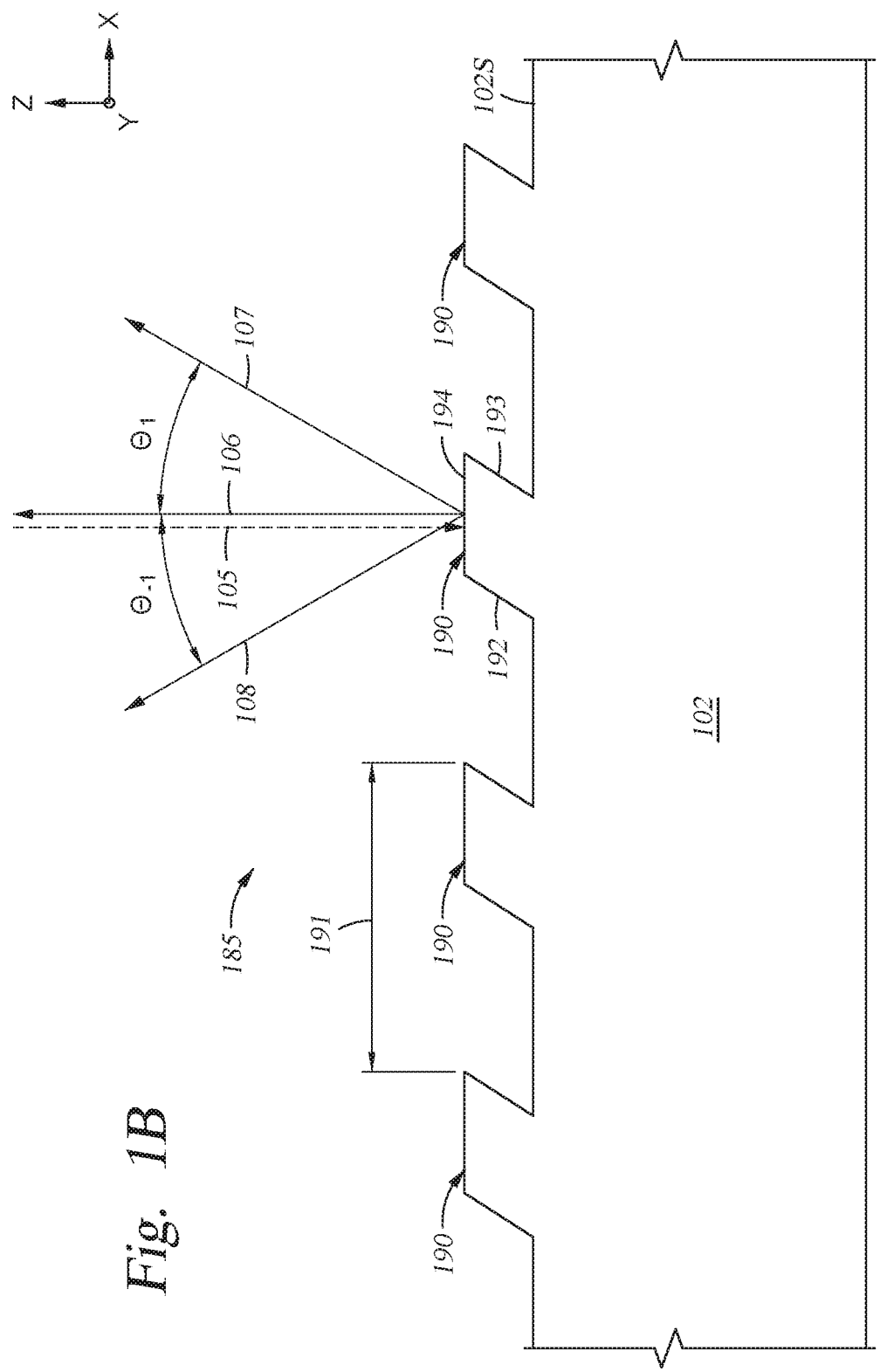

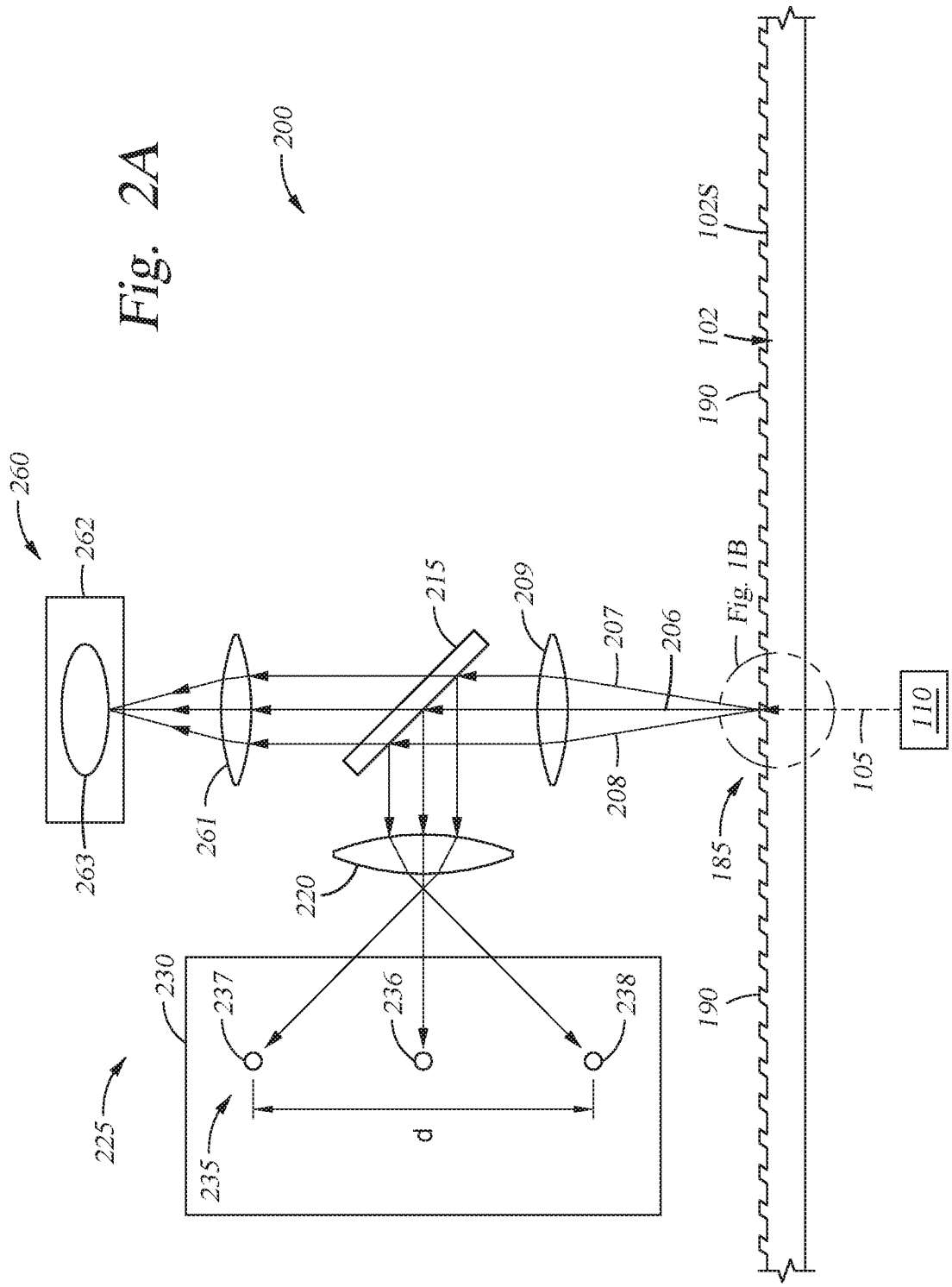

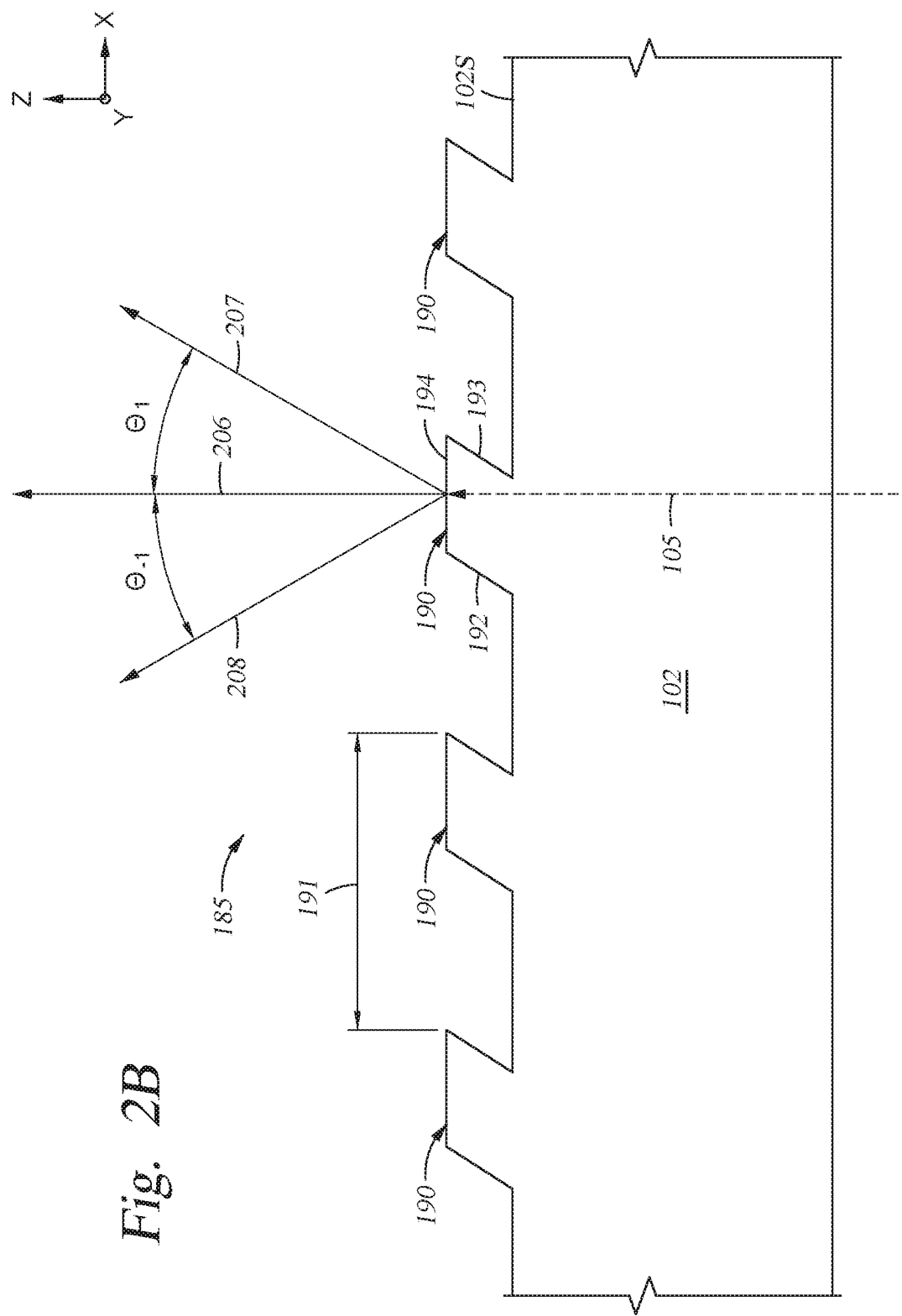

MEASUREMENT SYSTEM AND GRATING PATTERN ARRAY

CROSS-REFERENCE TO RELATED APPLICATIONS

This application claims priority to U.S. Provisional Patent Application No. 62/900,362, filed Sep. 13, 2019, which is hereby incorporated by reference in its entirety.

BACKGROUND

Field

Embodiments of the present disclosure relate to an apparatus and, more specifically, to a measurement system and a grating pattern array.

Description of the Related Art

Virtual reality (VR) is generally considered to be a computer generated simulated environment in which a user has an apparent physical presence. A VR experience can be generated in 3D and viewed with a head-mounted display (HMD), such as glasses or other wearable display devices that have near-eye display panels as lenses to display a VR environment that replaces an actual environment.

Augmented reality (AR), however, enables an experience in which a user can still see through the display lenses of the glasses or other HMD device to view the surrounding environment, yet also see images of virtual objects that are generated for display and appear as part of the environment. AR can include any type of input, such as audio and haptic inputs, as well as virtual images, graphics, and video that enhances or augments the environment that the user experiences. In order to achieve an AR experience, a virtual image is overlaid on an ambient environment, with the overlaying performed by optical devices. Fabricated optical devices tend to have non-uniform properties which must be accounted for to ensure proper functioning of the optical device, requiring accurate measurements of grating parameters, such as grating angles and grating pitch.

One drawback to measurement systems in the art is that precise angular control of the measured substrate is needed. Traditional optical measurement systems that reflect incident light of the surface require rotating stages in order to measure grating angles. In addition, the rotation of multiple optical and detector devices must be carefully controlled in convert in order to accurately capture reflected light from the gratings.

Therefore, what are needed in the art are measurement systems that do not require precise rotation control of a stage.

SUMMARY

Embodiments herein include measurement systems and grating pattern arrays. The measurement systems create incident light beams at about 90° with respect to the substrate surface, and thus a rotating stage is not required. The grating pattern arrays allow for easier location of different portions of gratings with different grating angles and pitches.

In one embodiment, a measurement system is provided, including a light source configured to create an incident light beam, a lens, and a beam splitter. The lens is configured to collimate an $R_0$ beam, an $R_1$ beam, and an $R_{-1}$ beam. The $R_0$ beam, the $R_1$ beam, and the $R_{-1}$ beam are created from a reflection of the incident light beam from a substrate into the beam splitter.

In another embodiment, a measurement system is provided, including a light source configured to create an incident light beam, a lens, and a beam splitter. The lens is configured to collimate a $T_0$ beam, a $T_1$ beam, and a $T_{-1}$ beam. The $T_0$ beam, the $T_1$ beam, and the $T_{-1}$ beam are created from a transmission of the incident light beam through a substrate into the beam splitter.

In yet another embodiment, a grating pattern array is provided. The grating pattern array is disposed on a substrate. The grating pattern array includes one or more grating regions. Each of the grating regions includes one or more main regions including a plurality of main gratings having a main grating angle and a main grating pitch, and one or more reference regions including a plurality of reference gratings having a reference grating angle and a reference grating pitch.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1A illustrates a schematic side view of a measurement system, according to one embodiment.

FIGS. 1B and 1C illustrate a zoomed in portion of a grating region during use of a measurement system, according to one embodiment.

FIG. 2A illustrates a schematic side view of a measurement system, according to one embodiment.

FIGS. 2B and 2C illustrate a zoomed in portion of a grating region during use of a measurement system, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1C:
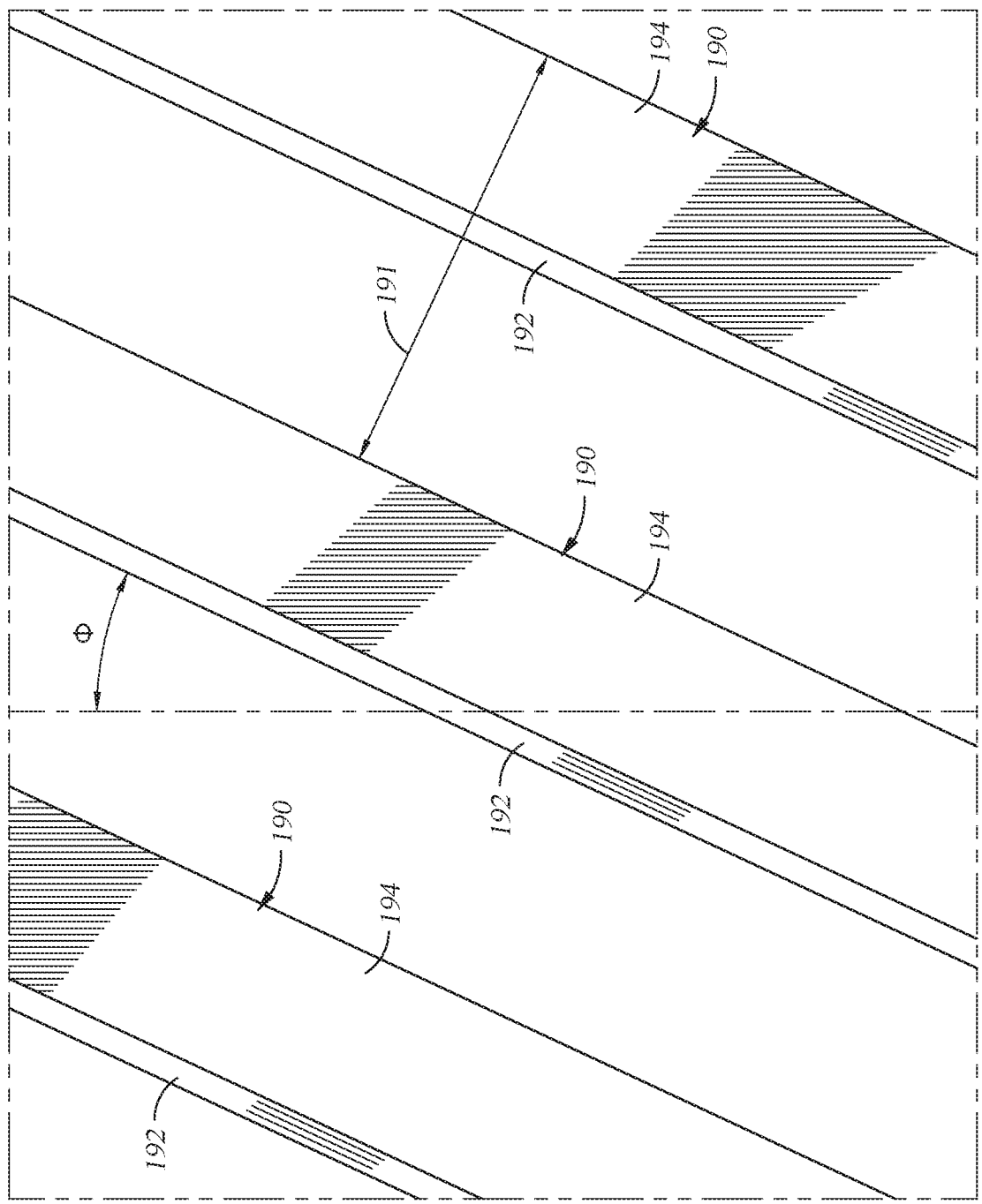

Embodiments of the present disclosure include measurement systems and grating pattern arrays. The measurement systems include multiple subsystems for creating diffraction patterns or magnified real images of grating regions on a substrate. The measurement systems are configured to reflect and transmit light beams, and the reflected and transmitted beams create diffraction patterns and enlarged images. The diffraction patterns and images provide information on grating pitch and angles of grating regions. Grating pattern arrays disposed on a substrate include main regions and reference regions. The reference regions are used to locate corresponding main regions. Embodiments disclosed herein may be useful for, but are not limited to, measurement systems that use reflected and transmitted light to measure properties of optical gratings.

As used herein, the term "about" refers to a +/−10% variation from the nominal value. It is to be understood that such a variation can be included in any value provided herein.

FIG. 1A illustrates a schematic side view of a measurement system 100, according to one embodiment. As shown, the measurement system 100 includes a light source 110, a source beam splitter 111, a lens 109, a beam splitter 115, a diffraction imaging system 125, a real imaging system 160, and a secondary diffraction imaging system 150. The measurement system 100 is configured to create an incident light beam 105 incident on a substrate 102. The substrate 102 is held by a stage (not shown) or by fasteners (not shown). The stage is moved either continuously or discretely as the measurement system 100 is used to measure properties of a grating region 185. The incident light beam 105 is created by the light source 110, and the incident light beam is reflected by the source beam splitter 111. The incident light beam 105 then reflects off the grating region 185 of the substrate 102, and the incident light beam is reflected into an $R_0$ beam 106, an $R_1$ beam 107, and an $R_{-1}$ beam 108. The light source 110 can be any light source used in the art, and the wavelength of the light is chosen with respect to the pitch of the grating in the grating region 185. The light source can be a single wavelength laser with a narrow bandwidth (<1 pm). In some examples, the laser wavelength is about 365 nm, about 488 nm (blue light), about 532 nm (green light), about 589 nm (orange light), and/or about 633 nm (red light).

The substrate 102 can be any used in the art, and can be either opaque or transparent depending on the use of the substrate. The material of the substrate 102 includes silicon (Si) or glass, according to some embodiments. The substrate 102 can be any size or shape, such as, but not limited to, 150 mm, 200 mm, or 300 mm diameter wafers.

FIGS. 1B and 1C illustrate a zoomed in portion of the grating region 185 during use of the measurement system 100, according to one embodiment. As shown, the grating region 185 includes a plurality of gratings 190. As shown, each grating 190 has a top surface 194, a first sloped side surface 192, and a second sloped side surface 193. However, it is to be understood that the cross-section of the grating 190 can be any shape, such as, but not limited to, square, rectangular, or trapezoidal. The gratings 190 can be meta-gratings, including smaller substructures. The gratings 190 make a grating angle Φ with respect to a direction y, wherein the direction y is parallel to the surface 102S of the substrate 102. The grating angle Φ can vary from about 0° to about 360°. The gratings 190 are separated by a grating pitch 191, and the grating pitch can vary from about 150 nm to about 10 μm.

The incident light beam 105 is incident on the surface 102S of the substrate at about 90° with respect to the surface. The $R_0$ beam 106 is reflected from the surface 102S at about 180° with respect to the incident light beam 105, the $R_1$ beam 107 is reflected from the surface at angle $\theta_1$, and the $R_{-1}$ beam 108 is reflected back from the surface at angle $\theta_{-1}$. The angles $\theta_1$ and $\theta_{-1}$ are about the same, according to some embodiments. The angle $\theta_1$ and the angle $\theta_{-1}$ can be about the same, or the angle $\theta_1$ and the angle $\theta_{-1}$ can be different if the incident beam is not normal to the gratings surface. The grating regions 185 and the substrate 102 are configured to be used in an optical device, such as, but not limited to, virtual reality (VR) or augmented reality (AR) displays.

Referring back to FIG. 1A, the lens 109 is configured to collimate the $R_0$ beam 106, the $R_1$ beam 107, and the $R_{-1}$ beam 108 onto the beam splitter 115. The numerical aperture of the lens 109 can range from about 0.1 to about 0.95 in air and up to about 1.5 with immersion oil. The lens 109 or any other of the lenses disclosed herein can be a microscope objective lens.

The measurement system 100 includes the diffracting imaging system 125, according to one embodiment. As shown, the diffraction imaging system 125 includes a diffracting imaging lens 120 and a diffracting imaging sensor 130. The beam splitter 115 is configured to reflect the $R_0$ beam 106, the $R_1$ beam 107, and the $R_{-1}$ beam 108 onto the diffraction imaging lens 120. The diffraction imaging lens 120 is configured to focus the $R_0$ beam 106, the $R_1$ beam 107, and the $R_{-1}$ beam 108 onto the diffraction imaging sensor 130, such that the beams form a diffraction pattern 135 on the diffraction imaging sensor. The diffraction pattern 135 includes a $0^{th}$ order spot 136 corresponding to the $R_0$ beam 106, and two $1^{st}$ order spots 137, 138 corresponding to the $R_1$ beam 107 and the $R_{-1}$ beam 108 respectively. Although only the $0^{th}$ order spot 136 and $1^{st}$ order spots 137, 138 are shown here, it is to be understood that any order spots could also be included in the diffraction pattern 135. Absence or blurriness of specific spots can indicate asymmetry or the presence of defects in the grating region 185.

Figure 1D:
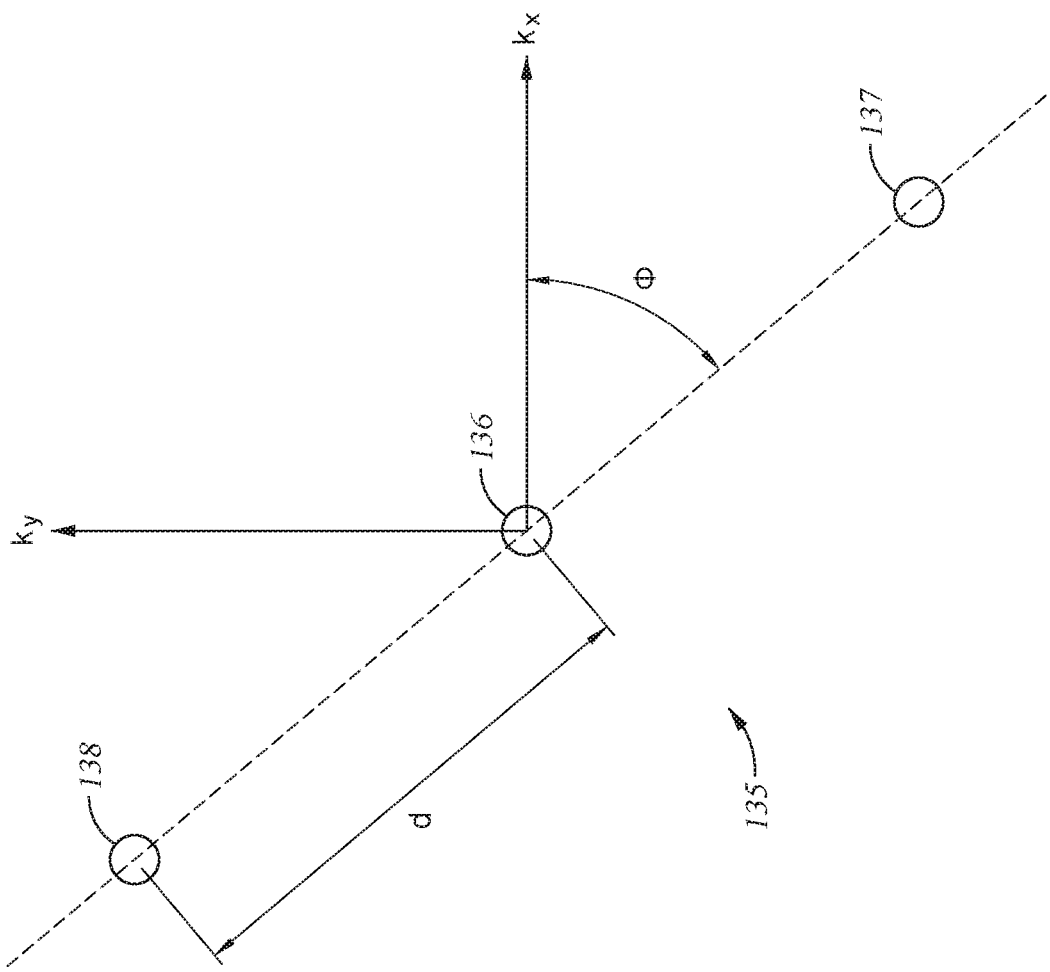
FIG. 1D illustrates a diffraction pattern, according to one embodiment.

FIG. 1D illustrates the diffraction pattern 135, according to one embodiment. The diffraction pattern 135 illustrated in FIG. 1D is also referred to as a back focal plane image. The diffraction pattern 135 is shown with respect to reciprocal plane axes $k_x$, $k_y$, where $k_x$ and $k_y$ are rotated 90° with respect to the x and y axes. The distance d between the $1^{st}$ order spots 152, 153 is proportional to $\tan(\theta_1)$ and/or $\tan(\theta_{-1})$. The diffraction imaging system 125 is configured to project the diffraction pattern 135 to the user, which enables the determination of the grating angle Φ. The grating pitch 191 can be determined using the equation $$P = \frac{m\lambda}{2\sin\theta}$$

where m is an integer, P is the grating pitch, and λ is the wavelength of the incident light. In addition, the grating angle Φ can be determined by measuring the angle between the $k_x$ axis and a line 198 that crosses through $1^{st}$ order spots 152, 153 and the $0^{th}$ spot 151.

The diffraction imaging sensor 130 includes a charge-coupled device (CCD) or complementary metal-oxide-semiconductor (CMOS), according to one embodiment. The resolution of the $0^{th}$ order spot 136 and the $1^{st}$ order spots 138, 137 is about 1 pixels to about 20 pixels of the imaging sensor 130, and the grating angle Φ error ranges from about 0.1° to about 1.0°. The diffraction image is analyzed to determine the grating angle Φ and the gratings pitch 191. As shown in FIG. 1C, the diffraction spots locations $R_{-1}$, $R_0$, $R_1$ (in pixels) are determined by the grating angles Φ and gratings pitch 191. With proper calibration and post image analysis, the gratings pitch 191 and gratings angle Φ can be determined accordingly.

The measurement system 100 includes the real imaging system 160, according to one embodiment. As shown, the real imaging system 160 includes a real imaging lens 161 and a real imaging sensor 162. At least a portion of the $R_0$ beam 106, the $R_1$ beam 107, and the $R_{-1}$ beam 108 pass through the beam splitter 115 and a secondary beam splitter 143 (if present). The real imaging lens 161 is configured to focus the $R_0$ beam 106, the $R_1$ beam 107, and the $R_{-1}$ beam 108 into a real image 163 onto the real imaging sensor 162. The real imaging sensor 162 includes a CCD, according to one embodiment. The real image 163 includes the magnified pattern of the grating region 185, and the real image 163 is analyzed to inspect gratings for defects, such as scratches and dust. The real imaging system 160 is configured to project the real image 163 on the real image sensor 162.

The measurement system 100 includes the secondary diffraction imaging system 150, according to one embodiment. As shown, the secondary diffraction imaging system 150 includes a secondary beam splitter 143, a secondary real imaging lens 141, a secondary real imaging sensor 180, a secondary diffraction imaging lens 142, and a secondary diffraction imaging sensor 145. The secondary beam splitter 143 is configured to reflect the $R_0$ beam 106, the $R_1$ beam 107, and the $R_{-1}$ beam 108 onto the secondary real imaging lens 141. The secondary real imaging lens 141 is configured to focus the $R_0$ beam 106, the $R_1$ beam 107, and the $R_{-1}$ beam 108 into a real image 181 onto the secondary real imaging sensor 180. The diffraction image 155 is analyzed to determine the grating angle $\Phi$ and the grating pitch 191.

At least a portion of the $R_0$ beam 106, the $R_1$ beam 107, and the $R_{-1}$ beam 108 passes through the secondary real imaging sensor 180 to the secondary diffraction imaging lens 142. The diffraction imaging lens 142 is tunable, such that the focal length of the diffraction imaging lens can be changed. The secondary diffraction imaging lens 142 is configured to focus the $R_0$ beam 106, the $R_1$ beam 107, and the $R_{-1}$ beam 108 onto the secondary diffraction imaging sensor 145, such that the beams form a diffraction pattern 155 on the diffraction imaging sensor. The diffraction pattern 155 includes a $0^{th}$ order spot 151 corresponding to the $R_0$ beam 106, and two 1st order spots 152, 153 corresponding to the $R_1$ beam 107 and the $R_{-1}$ beam 108 respectively. The distance d between the $1^{st}$ order spots 152, 153 is proportional to $\tan(\theta_1)$ and/or $\tan(\theta_{-1})$. The secondary diffraction imaging system 150 is configured to tune the distance between the diffraction spots on the detector by tuning the focal length of the diffraction imaging lens 142. Therefore, a larger range of gratings pitches 191 can be measured with high resolution. The secondary diffraction imaging system 150 is configured to project both the diffraction pattern 155 and the real image 181 to the user, which enables the determination of the grating angle $\Phi$.

The secondary diffraction imaging sensor 145 includes a charge-coupled device (CCD), according to one embodiment. The resolution of the $0^{th}$ order spot 151 and the $1^{st}$ order spots 152, 153 is about 1 pixels to about 20 pixels of the CCD, and the grating angle $\Phi$ error ranges from about 0.1° to about 1.0°.

It is to be understood that the measurement system 100 can include any combination of the diffraction imaging system 125, the real imaging system 160, and the secondary diffraction imaging system 150. In embodiments where the measurement system 100 includes two or more of the diffraction imaging system 125, the real imaging system 160, and the secondary diffraction imaging system 150, any of the sensors 130, 162, 145 can have the same or different resolution as any of the other sensors. Sensors 130, 162, 145 having different resolutions are useful for substrates 102 that contain different grating regions with varying grating angles and pitches. In addition, sensors 130, 162, 145 having different resolutions can be used to compare values of grating pitches and angles to verify the accuracy of the measurements.

Figure 2C:
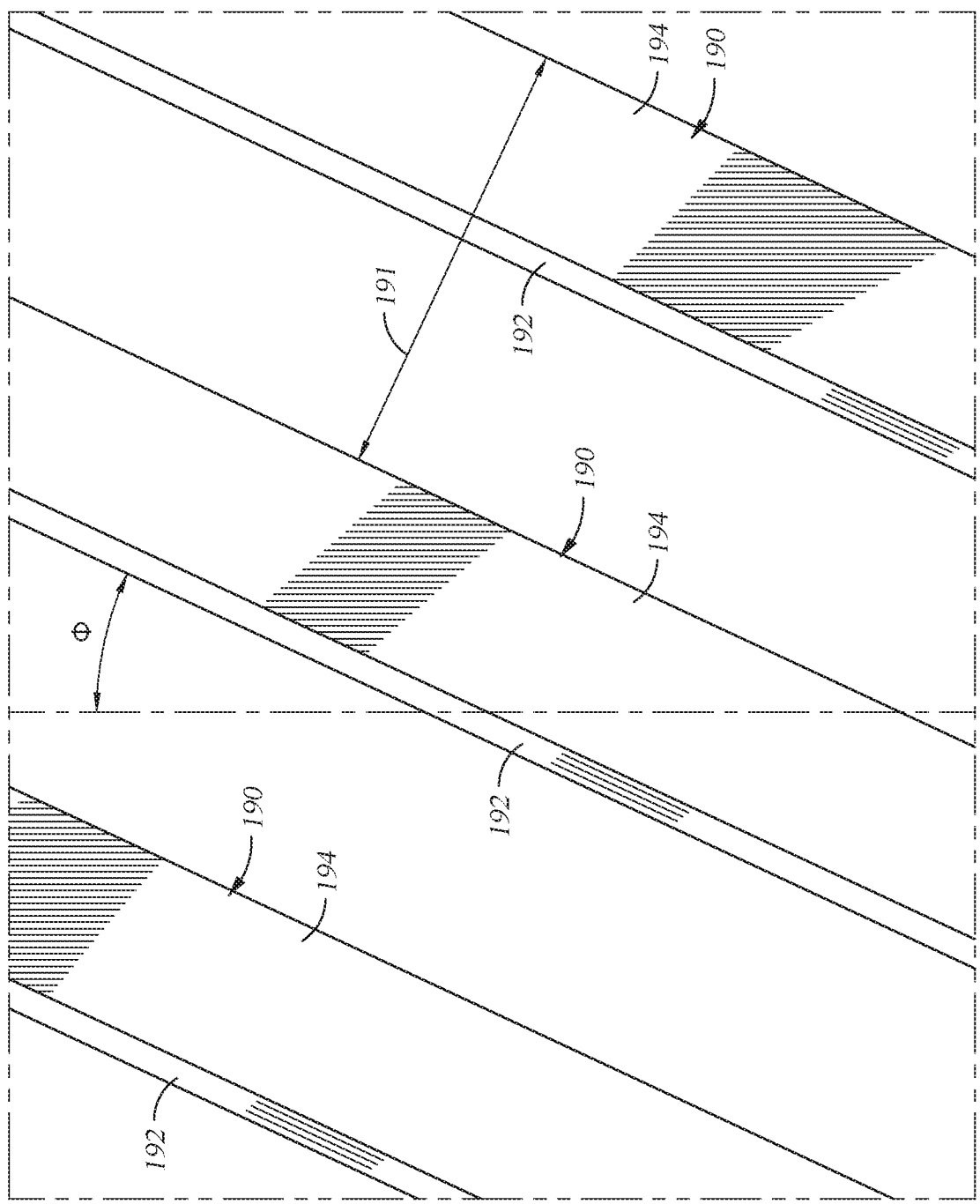

FIG. 2A illustrates a schematic side view of a measurement system 200, according to one embodiment. As shown, the measurement system 200 includes a light source 110, a lens 209, a beam splitter 215, a diffraction imaging system 225, and a real imaging system 260. The measurement system 200 is configured to create an incident light beam 105 incident on a substrate 102. The substrate 102 is held by a transparent stage (not shown) or by fasteners (not shown). The stage is moved either continuously or discretely as the measurement system 200 is used to measure properties of the grating region 185. The incident light beam 105 retransmits through a grating region 185 of the substrate 102, and the incident light beam is transmitted into a $T_0$ beam 206, a $T_1$ beam 207, and a $T_{-1}$ beam 208. The light source 110 can be any light source used in the art, and the wavelength of the light is chosen with respect to the pitch of the grating in the grating region 185. The wavelengths can be any of the wavelengths described above, FIGS. 2B and 2C illustrate a zoomed in portion of the grating region 185 during use of the measurement system 200, according to one embodiment. As shown, the grating region 185 includes a plurality of gratings 190. The incident light beam 105 is incident on the surface 102S of the substrate at about 90° with respect to the surface. The $T_0$ beam 206 is transmitted through the substrate at about 0° with respect to the incident light beam 105, the $T_1$ beam 207 is transmitted through the substrate at angle $\theta_1$, and the $T_{-1}$ beam 208 is transmitted through the substrate at angle $\theta_{-1}$. The angles $\theta_1$ and $\theta_{-1}$ are about the same, according to some embodiments. The angle $\theta_1$ and the angle $\theta_{-1}$ can be about the same, or the angle $\theta_1$ and the angle $\theta_{-1}$ can be different if the grating region 185 has asymmetry in the grating angle $\Phi$. The grating regions 185 and the substrate 102 are configured to be used in an optical device, such as, but not limited to, virtual reality (VR) or augmented reality (AR) displays.

Referring back to FIG. 2A, the lens 209 is configured to collimate the $T_0$ beam 206, the $T_1$ beam 207, and the $T_{-1}$ beam 208 onto the beam splitter 215. The focal length of the lens 209, or any other lens disclosed herein, can range from about 10 mm to about 1 m.

The measurement system 200 includes the diffracting imaging system 225, according to one embodiment. As shown, the diffraction imaging system 225 includes a diffracting imaging lens 220 and a diffracting imaging sensor 230. The beam splitter 215 is configured to reflect the $T_0$ beam 206, the $T_1$ beam 207, and the $T_{-1}$ beam 208 onto the diffraction imaging lens 220. The diffraction imaging lens 220 is configured to focus the $T_0$ beam 206, the $T_1$ beam 207, and the $T_{-1}$ beam 208 onto the diffraction imaging sensor 230, such that the beams form a diffraction pattern 235 on the diffraction imaging sensor. The diffraction pattern 235 includes a $0^{th}$ order spot 236 corresponding to the $T_0$ beam 206, and two $1^{st}$ order spots 237, 238 corresponding to the $T_1$ beam 207 and the $T_{-1}$ beam 208 respectively.

Figure 2D:
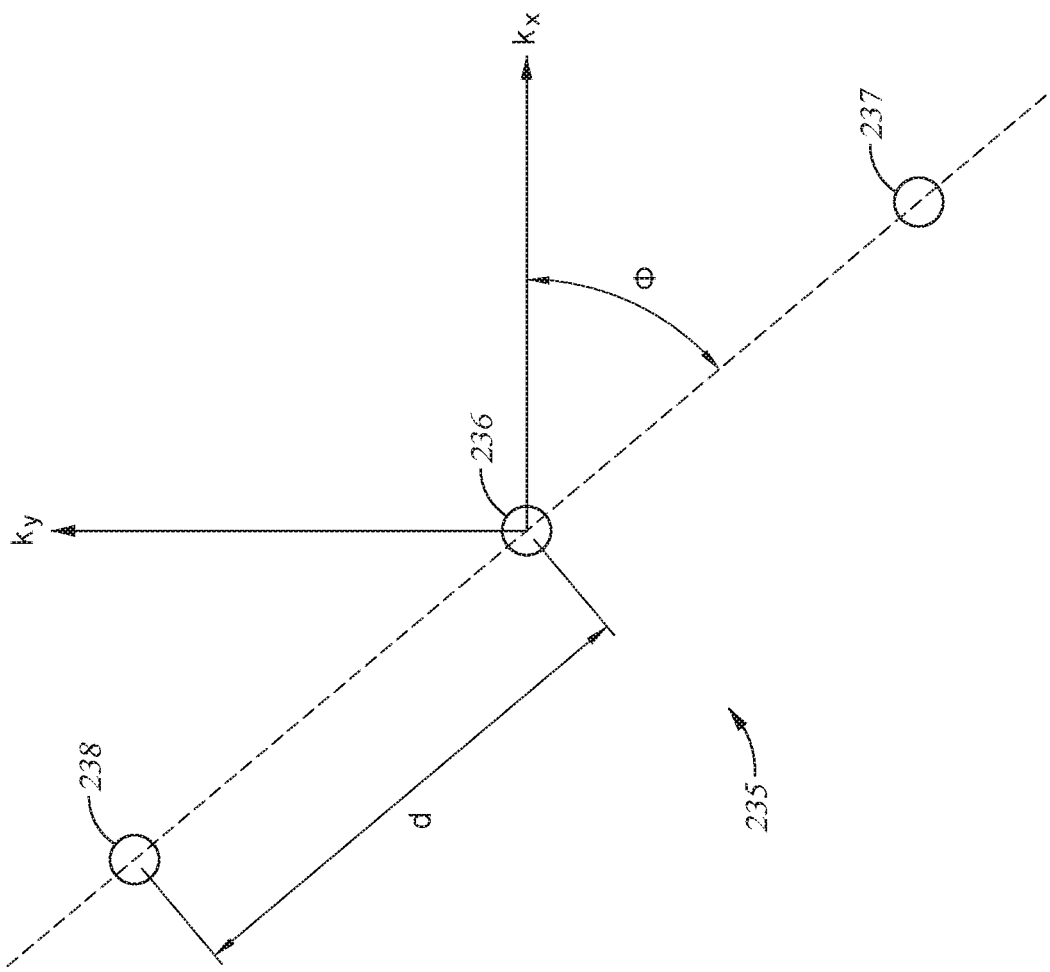
FIG. 2D illustrates a diffraction pattern, according to one embodiment.

FIG. 2D illustrates the diffraction pattern 235, according to one embodiment. The diffraction pattern 235 illustrated in FIG. 2D is also referred to as a back focal plane image. The diffraction pattern 235 is shown with respect to reciprocal plane axes $k_x$ and $k_y$, where $k_x$ and $k_y$ are rotated 90° with respect to the x and y axes. The distance d between the $1^{st}$ order spots 237, 238 is proportional to $\tan(\theta_1)$ and/or $\tan(\theta_{-1})$. The diffraction imaging system 225 is configured to project the diffraction pattern 235 to the user, which enables the determination of the grating angle $\Phi$. The grating pitch 191 can be determined using the equation:

$$P = \frac{m\lambda}{2\sin\theta}$$

where m is an integer, P is the grating pitch, and $\lambda$ is the wavelength of the incident light. In addition, the grating angle $\Phi$ can be determined by measuring the angle between the $k_x$ axis and a line 298 that crosses through $1^{st}$ order spots 152, 153 and the $0^{th}$ spot 151.

The diffraction imaging sensor 230 includes a CCD or CMOS, according to one embodiment. The resolution of the $0^{th}$ order spot 236 and the $1^{st}$ order spots 238, 237 is about 1 pixels to about 20 pixels of the diffraction imaging sensor 230, and the grating angle $\Phi$ error ranges from about 0.1° to about 1.0°.

The measurement system 100 includes the real imaging system 260, according to one embodiment. As shown, the real imaging system 260 includes a real imaging lens 261 and a real imaging sensor 262. At least a portion of the $T_0$ beam 206, the $T_1$ beam 207, and the $T_{-1}$ beam 208 pass through the beam splitter 215. The real imaging lens 261 is configured to focus the $T_0$ beam 206, the $T_1$ beam 207, and the $T_{-1}$ beam 208 into a real image 263 onto the real imaging sensor 262. The real imaging sensor 262 includes a CCD, according to one embodiment. The real image 263 includes the magnified pattern of the grating region 185, and the real image is analyzed to determine the grating angle $\Phi$ and the grating pitch 191. The real imaging system 260 is configured to project the real image 263 on the real image sensor 262.

In some embodiments, the measurement system 200 further includes one or more lenses (not shown) disposed between the light source and the substrate 102. These additional lenses can further focus the incident light beam 105 to a smaller width before the incident light beam is incident on the substrate 102. In some embodiments, a lens is located at a conjugate plane of the substrate 102, and another lens is located at a conjugate plane of the back focal plane of the lens 209. In addition, the width of the incident light beam 105 can controlled by an aperture diaphragm (not shown) located at the conjugate plane of the back focal plane of the lens 209 and by a field diaphragm (not shown) located at the conjugate plane of the substrate 102.

It is to be understood that the measurement system 200 can include any combination of the diffraction imaging system 225 and the real imaging system 260. In embodiments where the measurement system 100 includes both of the diffraction imaging system 225 and the real imaging system 260, the sensors 230, 262 can have the same or different resolution. Sensors 230, 262 having different resolutions are useful for substrates 102 that contain different grating regions with varying grating angles and pitches. In addition, sensors 230, 262 having different resolutions can be used to compare values of grating pitches and angles to verify the accuracy of the measurements.

The measurement systems 100, 200 do not include a rotating stage, and thus precise control of rotation of a stage is not needed. In addition, it is to be understood that the measurement systems 100, 200 can be combined into a single measurement system that is configured for measuring both reflection and transmission of the same light source 110. The combined measurement system is valuable for transparent substrates 102 with a large variety of grating region pitches and angles. For nontransparent substrates 102, the measurement system 100 can be used, as the measurement system 100 uses reflection of the incident light beam 105 rather than the transmission of the incident light beam. The measurement systems 100, 200 are contained in a single arm, and therefore careful calibration and control of multiple rotating arms is not necessary.

Figure 3A:
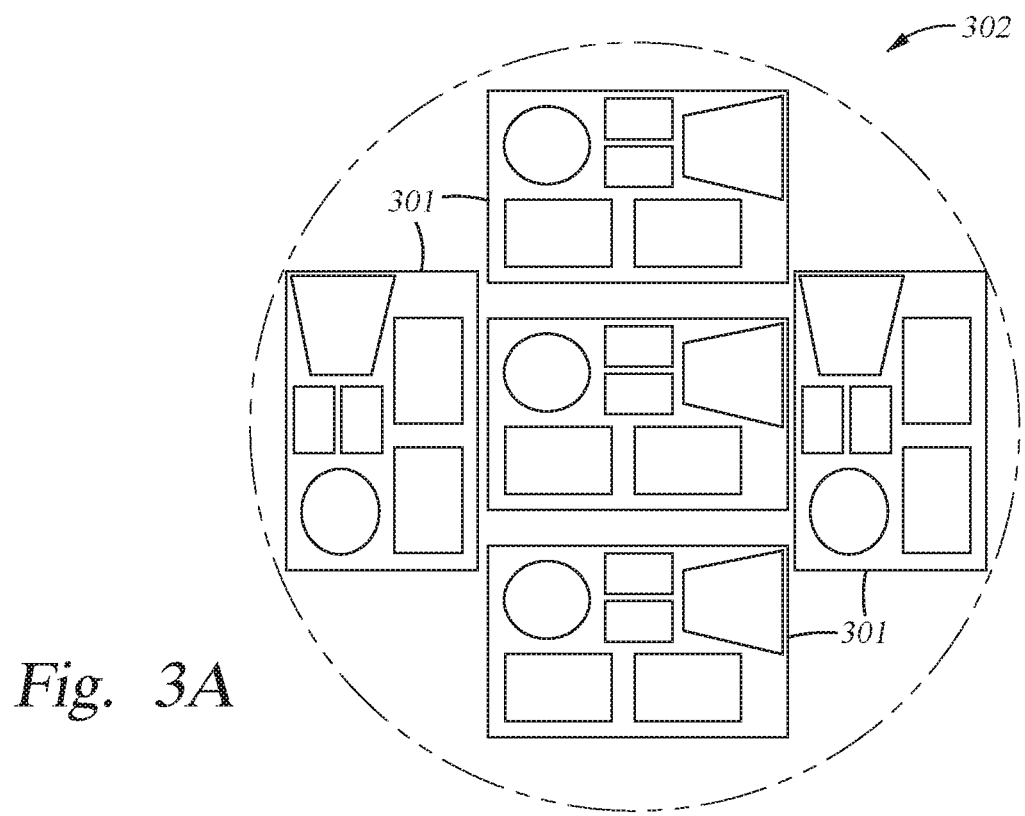
FIG. 3A illustrates a grating pattern array disposed on a substrate, according to one embodiment.

FIG. 3A illustrates a grating pattern array 302 disposed on the substrate 102, according to one embodiment. As shown, the grating pattern array 302 includes one or more grating regions 301. The grating regions 301 can be the same grating region 185 as described above. The grating pattern array 302 is configured to be used as part of an optical device, e.g., a VR or AR display.

Figure 3B:
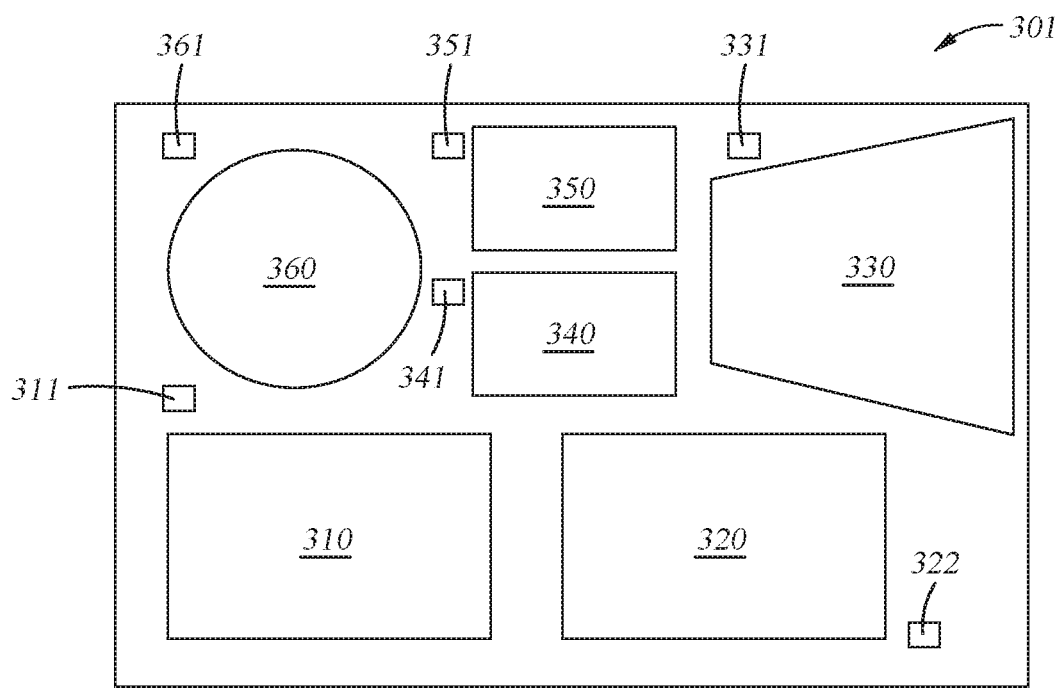
FIG. 3B illustrates a zoomed in portion of a grating region, according to one embodiment.

FIG. 3B illustrates a zoomed in portion of a grating region 301, according to one embodiment. As shown, the grating region 301 includes one or more main regions 310, 320, 330, 340, 350, 360, each main region having a grating with a grating angle $\Phi$ and a grating pitch 191, and one or more reference regions 311, 321, 331, 341, 351, 361, each reference region having a grating with a grating angle $\Phi$ and a grating pitch 191. The main regions 310, 320, 330, 340, 350, 360 have different main grating angles $\Phi$ from one another, according to one embodiment. The main regions 310, 320, 330, 340, 350, 360 can be the same or different pitches, according to one embodiment. The shape of the main regions 310, 320, 330, 340, 350, 360 can be the same or different, according to one embodiment. The grating region 301 is configured to be used as part of an optical device, e.g., a VR or AR display.

Each main region (e.g. 310) has a corresponding reference region (e.g. 311), and each of the reference region has the same gratings orientation as the corresponding main gratings region. Although FIG. 3B illustrates a system with a one-to-one ratio of main regions 310, 320, 330, 340, 350, 360 to reference regions 311, 321, 331, 341, 351, 361, it is contemplated that any ratio could be used (e.g., two reference regions for each main region), or that each main region could have any number of corresponding reference regions. The reference region 311 pitch $P_{ref}$ is about an integer multiple n of the corresponding main region 310 pitch $P_{main}$, i.e., $P_{ref}=n*P_{main}$, according to one embodiment. The combination of the reference region 311 with about the same grating angle $\Phi$ as the corresponding main grating 310 allows the user to easily locate the desired main grating for measurement.

Figure 4:
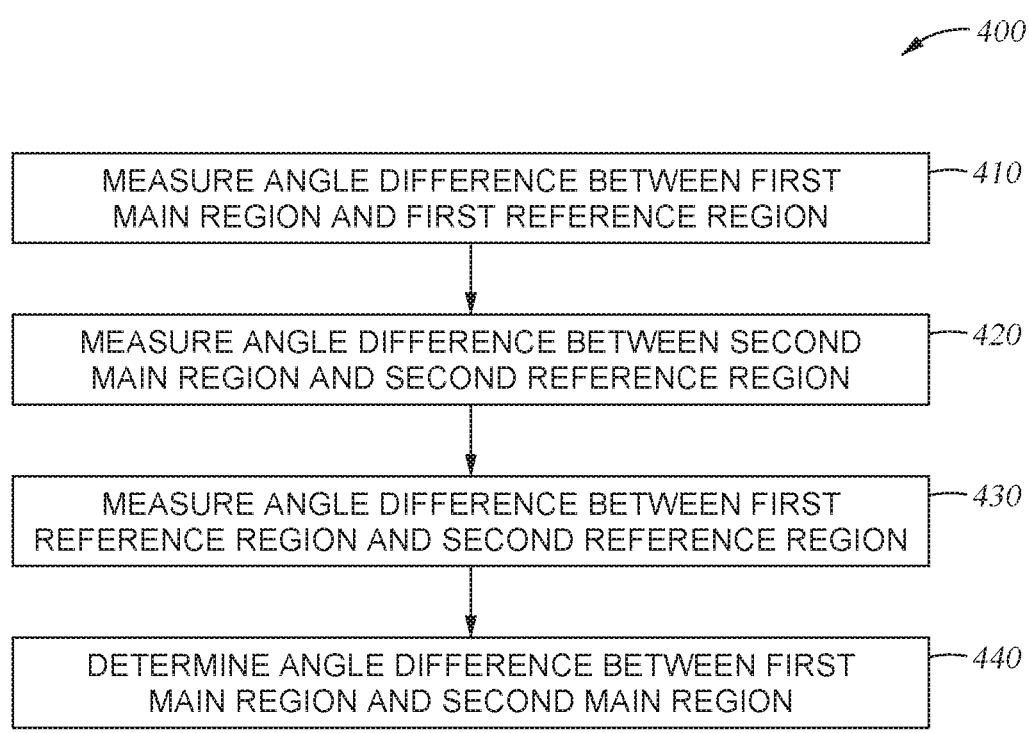
FIG. 4 is a flow diagram of method operations for comparing grating angles of different main gratings, according to one embodiment.

FIG. 4 is a flow diagram of method 400 operations for comparing grating angles $\Phi_A$, $\Phi_B$ of different main regions 310, 320, according to one embodiment. Each of the operations of method 400 can be performed by any embodiment of measurement systems 100, 200, or any measurement system described in U.S. patent application Ser. No. 16/539,930, filed Aug. 13, 2019, and/or U.S. Provisional Patent Application No. 62/834,219, filed Apr. 15, 2019, each of which is incorporated by reference in their entireties. Although the method operations are described in conjunction with FIG. 4, persons skilled in the art will understand that any system configured to perform the method 400 operations, in any order, falls within the scope of the embodiments described herein.

The method 400 begins at operation 410, where a difference in the grating angle $\Phi_A$ of a first main region (e.g., 310) and the grating angle $\Phi_{A1}$ of a corresponding first reference region (e.g., 311) is measured, the difference given by $\Phi_A-\Phi_{A1}$. The difference in grating angle can be measured using any of the measurement systems 100, 200 described above, or the difference in grating angle can be measured using an additional attached measurement system, such as a Littrow system.

At operation 420, a difference in the grating angle $\Phi_B$ of a second main region (e.g., 320) and the grating angle $\Phi_{B1}$ of a corresponding second reference region (e.g., 321) is measured, the difference given by $\Phi_B-\Phi_{B1}$. The difference in grating angle can be measured using any of the measurement systems 100, 200 described above.

At operation 430, a difference in the grating angle $\Phi_{A1}$ of the first reference region (e.g., 311) and the grating angle $\Phi_{B1}$ of the second reference region (e.g., 321) is measured, the difference given by $\Phi_{A1}-\Phi_{B1}$. The difference in grating angle can be measured using any of the measurement systems 100, 200 described above.

At operation 440, a difference in the grating angle $\Phi_A$ of the first main region (e.g., 310) and the grating angle $\Phi_B$ of the second main region (e.g., 320) is determined, the difference given by $\Phi_A-\Phi_B$ determined by the formula $$(\Phi_A-\Phi_B)=(\Phi_A-\Phi_{A1})-(\Phi-\Phi_{B1})+(\Phi_{A1}-\Phi_{B1}).$$

Comparing grating angles $\Phi_{A1}$, $\Phi_{B1}$ of the reference regions 311, 321 allows for indirect measurement of differences of grating angles $\Phi_A$, $\Phi_B$ between main regions 310, 320. In addition, the reference regions 311, 321 have larger pitches than the corresponding main regions 310, 320, and thus the grating angles $\Phi_{A1}$, $\Phi_{B1}$ can be measured using longer wavelengths of light than would be necessary for measuring the grating angles $\Phi_A$, $\Phi_B$ of the corresponding main regions. For example, a main region 310 with a grating pitch $P_{main}$ of about 400 nm would require a laser source creating light with a wavelength less than 400 nm, whereas measuring the corresponding reference region 311 with a grating pitch $P_{ref}=2P_{main}=800$ nm can be measured using a laser source creating light with a wavelength less than 800 nm, and typically visible light is easier to create than ultraviolet light.

As described above, a measurement system includes multiple subsystems for creating diffraction patterns or magnified real images of grating regions on a substrate. The measurement systems are configured to reflect and transmit light, and the reflected and transmitted beams create diffraction patterns and enlarged images. The diffraction patterns and images provide information on grating pitch and angles of grating regions. Grating pattern arrays disposed on a substrate include main regions and reference regions. The reference regions are used to locate corresponding main regions.

The measurement systems do not include a rotating stage, and thus precise control of rotation of a stage is not needed. The measurement systems are contained in a single arm, and therefore careful calibration and control of multiple rotating arms is not necessary. The measurement systems can be orthoscopic, i.e., provide images with minimal distortion, and/or the measurement systems can be conoscopic, i.e., provide an image by measuring through a transparent substrate. Comparing grating angles of reference regions allow for indirect measurement of differences of grating angles between main regions.

While the foregoing is directed to embodiments of the present disclosure, other and further embodiments of the disclosure may be devised without departing from the basic scope thereof, and the scope thereof is determined by the claims that follow.

What is claimed is:

1. An optical device comprising:
   one or more grating regions, each of the grating regions comprising:
      one or more main regions comprising a plurality of main gratings each having a main grating angle and a main grating pitch; and
      one or more reference regions comprising a plurality of reference gratings each having a reference grating angle and a reference grating pitch, wherein:
         each reference grating pitch is greater than each main grating pitch;
      a corresponding main region of the one or more main regions has a corresponding reference region of the one or more reference regions; and
      a corresponding reference grating pitch of the corresponding reference region is about an integer multiple of a corresponding main grating pitch of the corresponding main region.

2. The optical device of claim 1, wherein a first main grating of the one or more main regions has a first main grating angle and a second main grating of the one or more main regions has a second main grating angle, wherein the second main grating angle is different from the first main grating angle.

3. The optical device of claim 1, wherein a first main region of the one or more main regions has a different shape than a second main region of the one or more main regions.

4. The optical device of claim 1, wherein the corresponding main region comprises a corresponding main grating angle that is about equal to a corresponding reference grating angle of the corresponding reference region.

5. The optical device of claim 1, wherein the integer is 2.

6. The optical device of claim 1, wherein at least one of the plurality of main gratings has a cross-sectional shape selected from a group consisting of a square, a rectangle, or a trapezoid.

7. The optical device of claim 1, wherein each reference grating pitch is about 150 nm to about 10 μm.

8. An optical device comprising:
   two or more grating regions, each of the grating regions comprising:
      one or more main regions comprising a plurality of main gratings, each having a main grating angle and a main grating pitch; and
      one or more reference regions comprising a plurality of reference gratings, each having a reference grating angle and a reference grating pitch,
         wherein each main grating pitch is greater than or equal to a first wavelength and the reference grating pitch is greater than or equal to a second wavelength within a visible light spectrum, and wherein each reference grating pitch of the one or more reference regions is about an integer multiple of a corresponding main grating pitch of the one or more main regions.

9. The optical device of claim 8, wherein a first main grating of the plurality of main gratings corresponds to a first reference grating and a second reference grating of the plurality of reference gratings, wherein the first reference grating and the second reference grating are configured to provide information related to a first location of the first main grating.

10. The optical device of claim 9, wherein a reference angle difference between a first reference angle ($\Phi_{A1}$) of the first reference grating and a second reference angle ($\Phi_{B1}$) of the second reference grating corresponds to a main angle difference between the first main grating and a second main grating of the plurality of main gratings.

11. The optical device of claim 10, wherein a first angle difference between a first main angle ($\Phi_A$) of the first main grating and the first reference angle ($\Phi_{A1}$) corresponds to the main angle difference, and a second angle difference between a second main angle ($\Phi_B$) of the second main grating and the second reference angle ($\Phi_{B1}$) corresponds to the main angle difference ($\Phi_A-\Phi_B$) defined by:

$$(\Phi_A-\Phi_B)=(\Phi_A-\Phi_{A1})-(\Phi_B-\Phi_{B1})+(\Phi_{A1}-\Phi_{B1}).$$

12. The optical device of claim 8, wherein the plurality of reference gratings is configured to be readable by a light source comprising a wavelength less than 800 nm.

13. An optical device comprising,
- a first plurality of main gratings, each of the first plurality of main gratings having a main grating angle and a main grating pitch; and
- a first plurality of reference gratings, each of the first plurality of reference gratings having a reference grating angle and a reference grating pitch, each reference grating pitch is about 150 nm to about 10 μm, and wherein:
- the main grating pitch is equal to a first wavelength within a first light spectrum and the reference grating pitch is equal to a second wavelength within a second light spectrum;
- the second light spectrum is different from the first light spectrum; and
- each reference grating pitch is an integer multiple of each main grating pitch.

14. The optical device of claim 13, wherein each reference grating of the first plurality of reference gratings is configured to be readable by a single wavelength laser comprising blue light, green light, orange light, red light, or combinations thereof.

15. The optical device of claim 13, wherein the optical device is transparent.

16. The optical device of claim 13, further comprising a first main region comprising the first plurality of main gratings; and a second main region comprising a second plurality of main gratings, wherein a first shape of the first main region is different from a second shape of the second main region.

17. The optical device of claim 13, further comprising a first main region comprising the first plurality of main gratings; and a second main region comprising a second plurality of main gratings, wherein a first shape of the first main region is the same as a second shape of the second main region.

18. The optical device of claim 13, wherein each reference grating of the first plurality of reference gratings is configured to be readable by a laser having a wavelength less than 800 nm.

19. The optical device of claim 13, wherein the first light spectrum is an ultraviolet light spectrum and the second light spectrum is a visible light or infrared light spectrum.

20. The optical device of claim 1, further comprising:
- a substrate, wherein the one or more grating regions comprises at least two grating regions extending from a surface of the substrate, wherein at least one of the plurality of main gratings comprises a grating surface that is sloped with respect to an axis perpendicular to the surface of the substrate.

* * * * *